United States Patent [19]

Matsuda

[11] Patent Number: 4,604,638
[45] Date of Patent: Aug. 5, 1986

[54] FIVE LAYER SEMICONDUCTOR DEVICE WITH SEPARATE INSULATED TURN-ON AND TURN-OFF GATES

[75] Inventor: Hideo Matsuda, Yokohama, Japan

[73] Assignee: Kabushiki Kaisha Toshiba, Kawasaki, Japan

[21] Appl. No.: 610,780

[22] Filed: May 16, 1984

[30] Foreign Application Priority Data

May 17, 1983 [JP] Japan .................................. 58-86062
Sep. 2, 1983 [JP] Japan .................................. 58-161452

[51] Int. Cl.[4] ............................................ H01L 29/78
[52] U.S. Cl. ................................ 357/23.4; 357/23.14;
357/30; 357/38; 357/43; 357/86; 507/252.6
[58] Field of Search ..................... 357/23, 4, 38, 38 G,
357/38 T, 43, 30, 86, 65, 23.14; 307/252 A, 252
B, 252 C, 252 G, 304, 305

[56] References Cited

U.S. PATENT DOCUMENTS

| | | | |
|---|---|---|---|
| 3,307,049 | 2/1967 | Von Bernuth et al. | 307/252 G |
| 3,590,346 | 6/1971 | Bilo et al. | 357/65 |
| 3,770,989 | 11/1973 | Shaw | 307/252 A |
| 3,831,187 | 8/1974 | Neilson | 357/23.4 |
| 4,224,634 | 9/1980 | Svedberg | 357/38 |
| 4,244,000 | 1/1981 | Veda et al. | 352/30 |
| 4,261,001 | 4/1981 | Temple et al. | 357/38 |
| 4,295,058 | 10/1981 | Lade et al. | 357/38 |
| 4,402,003 | 8/1983 | Blanchard | 357/23.4 |
| 4,443,810 | 4/1984 | Yatsuo et al. | 307/252 C |
| 4,466,010 | 8/1984 | Patalong | 307/252 C |

FOREIGN PATENT DOCUMENTS 53-2089  1/1978 Japan .................................. 357/38 G
56-83066 7/1981 Japan .

OTHER PUBLICATIONS

L. Sevin, "Field Effect Transistors," ®1965, Texas Instruments, McGraw-Hill Book Co., p. 124.
Baliga, et al., "The Insulated Gate Rectifier (IGR): A New Power Switching Device", IEDM pp. 264-267, (1982).

Primary Examiner—Joseph E. Clawson, Jr.
Attorney, Agent, or Firm—Finnegan, Henderson, Farabow, Garrett & Dunner

[57] ABSTRACT

A semiconductor device has first and second layers of n-type conductivity, a third layer of p-type conductivity which is formed between the first and second layers, a fourth layer of p-type conductivity which is in contact with the second layer, and a gate electrode which is capacitively coupled through an insulation layer with the third layer to constitute a MOS gate thyristor. The semiconductor device further has first terminals through which a voltage is supplied to the gate electrode to form a current channel in the third layer portion under the insulation layer, and second terminals for supplying a reverse bias voltage between the first and third layers.

10 Claims, 18 Drawing Figures

FIVE LAYER SEMICONDUCTOR DEVICE WITH SEPARATE INSULATED TURN-ON AND TURN-OFF GATES

BACKGROUND OF THE INVENTION

The present invention relates to a semiconductor device having a gate turn-off (GTO) thyristor.

A GTO thyristor is a kind of reverse blocking triode thyristor, which is made conductive in response to a trigger pulse and self-holds this conduction state. Generally, a reverse blocking triode thyristor cannot be turned off without a commutation circuit functioning to reverse the current flowing through the thyristor. However, this GTO thyristor has the feature such that it can become nonconductive in response to a trigger pulse of the opposite polarity. Therefore, this GTO thyristor can be connected between a DC power source and a load as a switching element.

FIG. 1 shows a structure of a conventional GTO thyristor. This GTO thyristor includes an anode emitter 10P and a cathode base 12P which are formed of a p-type semiconductor, and an anode base 14N and a plurality of (for example, three) cathode emitters 16N-1 to 16N-3 which are formed of an n-type semiconductor. The anode emitter 10P is connected to an anode terminal A through an anode electrode 18. The cathode emitters 16N-1 to 16N-3 are respectively connected to a terminal K through cathode electrodes 20-1 to 20-3. The DC power source and load (not shown) can be connected in series to the GTO thyristor through the terminals A and K. The cathode base 12P is connected to a terminal G through a gate electrode 22 which is formed on the cathode base 12P so as to surround the cathode emitters 16N-1 to 16N-3 on a plane.

In the GTO thyristor of FIG. 1, when the potential of the terminal G is set higher than that of terminal K to apply a forward bias voltage to the p-n junctions between the cathode base 12P and each of the cathode emitters 16N-1 to 16N-3, a current path is formed between the terminals A and K. On the other hand, the potential of the terminal G is set lower than that of the terminal K to supply a reverse bias voltage, this current path is extinguished. In addition, the reason why a plurality of cathode emitters 16N-1 to 16N-3 surrounded by the gate electrode 22 are provided for the GTO thyristor is to allow a current to uniformly flow in the semiconductor elements among the cathode electrodes 16N-1 to 16N-3 and the anode electrode 18. Otherwise, there is the fear that some semiconductor elements will be destroyed due to a centralized current to be caused at the time of a sudden current change.

On the other hand, a very large trigger current is needed to turn off the GTO thyristor with such a structure. For example, there is a large-sized GTO thyristor which is turned on by a trigger current of at least 1A and which can present a good turn-on characteristic by a trigger current of about 10A; however, a trigger current of at least several hundreds of A is necessary to turn off this GTO thyristor.

On one hand, FIG. 2 shows a GTO thyristor in which a current supply section for supplying a driving current from the anode electrode 18 to the gate electrode 22 was added to the GTO thyristor shown in FIG. 1. This GTO thyristor has a second cathode emitter 24N and a second gate electrode 26 which is formed of an n-type semiconductor. The cathode emitter 24N and gate electrode 26 are both formed on the cathode base 12P. The gate electrode 22 is formed in contact with the cathode emitter 24N and the terminal G is connected to the gate electrode 26. The gate electrode 22 is connected to the gate electrode 26 through a diode 28 for supplying a reverse bias voltage, corresponding to the voltage drop, between the cathode base 12P and the cathode emitter 24N to attain the turn-off condition.

The GTO thyristor with such a structure can be rendered conductive by a trigger current which is about one tenth of that in case of the thyristor shown in FIG. 1. However, in this GTO thyristor, since the gate electrode 22 partially short-circuits the cathode base 12P and cathode emitter 24N, a reverse bias voltage is not sufficiently applied to the p-n junction between the cathode base 12P and cathode emitter 24N when the potential of the terminal G is set lower than that of terminal K to effect turn-off operation. Due to this, it takes a long time until the current which flows through the p-n junction is completely cut off, which results in a loss of electric power. In addition, if a large current is flowing between the terminals A and K, there may be a case where this p-n junction will be damaged due to the current therethrough at the time of turn-off.

FIG. 3 illustrates a thyristor with a metal oxide silicon (MOS) gate structure. This thyristor has a p-type layer 32P to which an anode electrode 30 is connected, an n-type layer 34N which is formed on this layer 32P, a p-type layer 36P which is formed in the surface area of the layer 34N, and an n-type layer 38N which is formed in the surface area of the layer 36P. A cathode electrode 40 is formed on the layers 36P and 38N. The gate electrode 42 is formed on the layers 34N, 36P and 38N through an insulation layer 44.

When the potential of the terminal G is set lower than that of the terminal K, a current channel is formed in the portion of the layer 36P located immediately under the insulation layer 44, so that a current flows from the anode electrode 30 to the cathode electrode 40 through the channel. When this current is larger than a predetermined value (i.e., breakover current), an electrical barrier disappears between the layers 34N and 36P, thereby allowing a current to flow from the layer 36P to the layer 38N irrespective of the presence and absence of the channel. In this case, once this thyristor has been made conductive, it is impossible to control through the terminals G and K so as to make it nonconductive. However, the above-mentioned thyristor has the capability of being made conductive by only a current on the order of $\mu A$ for charging the capacitance between the gate electrode 42 and the layer 36P.

The thyristor shown in FIG. 4 is substantially identical to that in FIG. 3 in principle, although a p-type layer 46 to which an anode electrode 48 has been connected is formed in the surface area of the layer 34N.

SUMMARY OF THE INVENTION

It is an object of the present invention to provide a semiconductor device having a GTO thyristor which is completely turned on and turned off by a minute electric power consumption.

According to the invention, there is provided a semiconductor device having a gate turn-off thyristor which comprises first and second layers of one conductivity type, a third layer of an opposite conductivity type which is formed between said first and second layers, a fourth layer of the opposite conductivity type which is formed in contact with said second layer, first and second electrodes which are respectively formed on said first and fourth layers, a third electrode which is formed on said third layer, said first and third electrodes being supplied with a turn-off voltage to apply a reverse bias voltage between said first and third layers, and a fourth electrode which is insulatively formed on that portion of said third layer which lies between said first and second layers, said third and fourth electrodes being supplied with a turn-on voltage to form a current channel in said third layer.

DETAILED DESCRIPTION OF THE PREFERRED EMBODIMENTS

Figure 5:
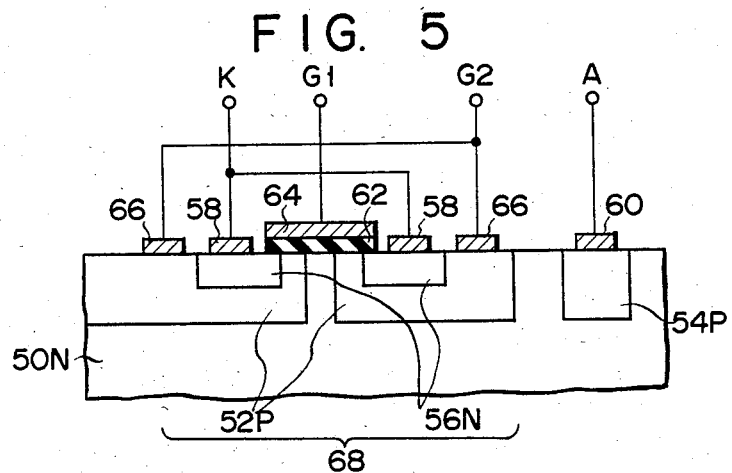
FIG. 5 is a diagram showing a structure of a semiconductor device according to one embodiment of the present invention.

Embodiments of the present invention will be described with reference to FIGS. 5 to 18. FIG. 5 shows a structure of a semiconductor device according to a first embodiment. This semiconductor device has, for example, an n-type layer 50N, p-type layers 52P and 54P which are formed in the surface area of the layer 50N, and an n-type layer 56N which is formed in the surface area of the layer 52P. In particular, the layer 52P surrounds a portion of the layer 50N, and the layer 56N surrounds the portion of the layer 50N surrounded by the layer 52P. A cathode electrode 58 is formed on the layer 56N, and an anode electrode 60 is formed on the layer 54P. Cathode and anode electrodes 58 and 60 are respectively connected to terminals K and A. An insulation layer 62 is formed on the layers 50N, 52P and 56N. A first gate electrode 64 is formed through the insulation layer 62 over the surface area of the layer 52P. The first gate electrode 64 is connected to a gate terminal G1. A second gate electrode 66 is formed on the layer 52P and is connected to a terminal G2.

In operation, when the potential of the terminal G1 is set higher than that of the terminal G2, a current channel is formed in the portion of the layer 52P which lies directly under the insulation layer 62. At this time a current can flow from the anode electrode 60 to the cathode electrode 58 through the layer 54P, layer 50N, current channel in the layer 52P, and layer 56N. Namely, the portion between the terminals A and K of this semiconductor device is rendered conductive. When a predetermined amount of current (i.e., breakover current) flows through the current path between the terminals A and K, the electrical barrier between the layers 52P and 50N disappears. In this condition, even if the voltage is not supplied between the terminals G1 and G2, a current will continuously flow through the current path. On the other hand, when the potential of the terminal G2 is set lower than that of the terminal K, a reverse bias voltage is applied to the p-n junction of the layers 52P and 56N and the current flowing therethrough is blocked.

In the above described semiconductor device, a charge current flows to the insulation gate of the MOS gate thyristor immediately after a trigger voltage has been supplied, but when this charging is ended, the electric power will hardly be consumed. In addition, since this device has the terminal G2, a reverse bias voltage can be applied to the p-n junction between the layers 52P and 56N sufficient to attain a complete turn-off condition. Furthermore, in this semiconductor device, the current density in the MOS gate thyristor becomes uniform around each electrode. Therefore, it is difficult to damage the semiconductor device when it is turned on or turned off.

Figure 6:
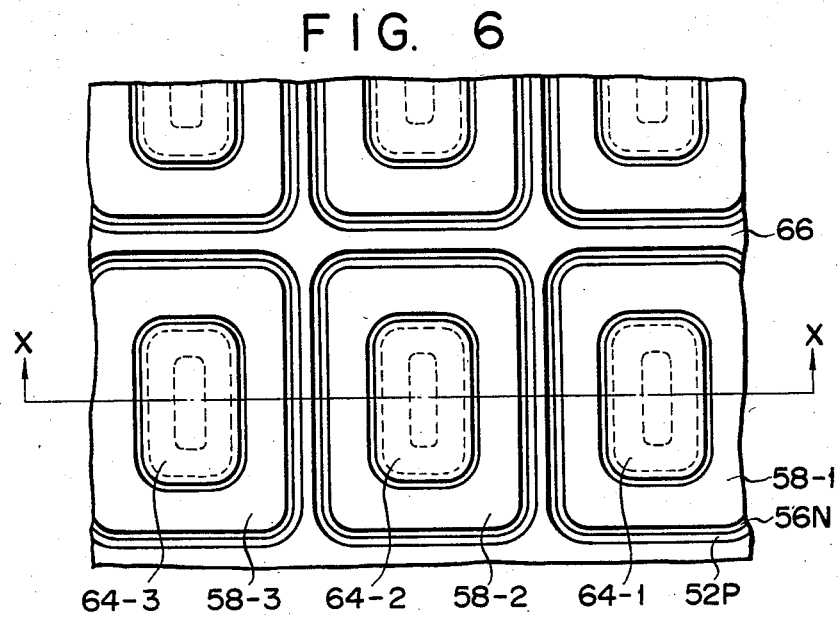
FIG. 6 illustrates a schematic top plan pattern of a semiconductor device in which a plurality of portions each having a MOS gate structure shown in FIG. 5 are provided.
Figure 7:
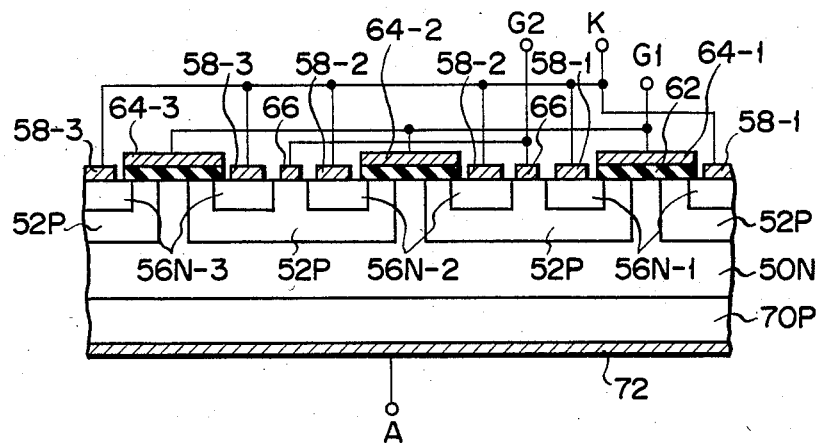
FIG. 7 shows a structure of a cross section taken along the line X—X of FIG. 6.

A semiconductor device according to a second embodiment is used in the case of controlling a large anode current between the terminals A and K. FIG. 6 shows a schematic top plan pattern thereof, while FIG. 7 shows a structure of a cross section taken along the line X—X of FIG. 6. A plurality of such structural portions 68 of FIG. 5 are provided in parallel for this device. In the diagrams which will be referred to with respect to this and the subsequent embodiments, the same elements and components will be designated by the same reference numerals. In the case where there are a plurality of the same component portions, a suffix will be added to each numeral. In case of this embodiment, a layer 70P is formed under the layer 50N in place of the layer 54P (FIG. 5), and the terminal A is connected to an anode electrode 72 which is formed in contact with the layer 70P.

Although this device operates substantially in the same manner as the foregoing embodiment, it can control a large anode current depending upon the number of MOS gate thyristors.

Figure 8:
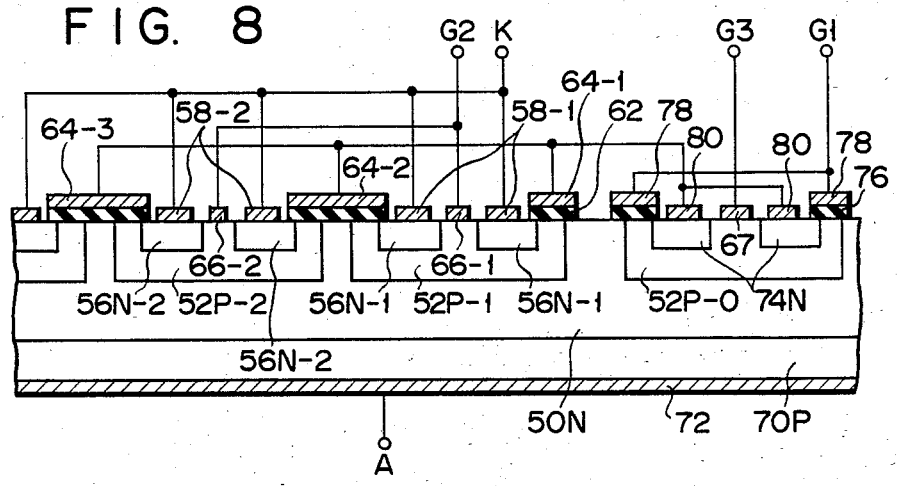
FIG. 8 shows a semiconductor device which is similar to FIG. 7 and which further has a MOS gate circuit for setting the potential of the gate electrode of a MOS gate thyristor at a level almost equal to that of the anode electrode.

FIG. 8 shows a semiconductor device according to a third embodiment. This device has the p-type layer 70P and anode electrode 72 which are formed similarly to the device in FIG. 7. The features of this device are that it has an MOS gate circuit for setting the potential of the gate electrodes 64-1 to 64-3 at a level almost equal to that of the anode electrode 72, and that this MOS gate circuit has the p-type layer 70P, the n-type layer 50N which is formed in contact with the layer 70P, a p-type layer 52P-1 which is formed in the surface area of the layer 50N, an n-type layer 74N which is formed in the surface area of the layer 52P-0, and a gate electrode 78 which is formed through an insulation layer 76 on the portion of the layer 52P-1 locating between the layers 50N and 74N. The gate electrode 78 is connected to the terminal G1. The gate electrodes 64-1 to 64-3 are connected to an electrode 80 which is formed on the layer 74N. A terminal G3 is connected to a electrode 67 which is formed on the layer 52P-1. In addition, cathode electrodes 58-1 and 58-2 of this device surround gate electrodes 66-1 and 66-2 which are connected to the terminal G2.

When the potential of the terminal G1 is set higher than that of the terminal G3, a current channel is formed in the portion of the layer 52P-0 directly under the insulation layer 76. This current channel permits to set the potential of the electrodes 58-1, 58-2 at a level almost equal to that of the anode electrode 72, this causes to make the GTO thyristor conductive, whereby the potential of the terminal G2 is lower than that of the electrodes 58-1 and 58-2. In the turn-off operation, this device operates in the same manner as the device shown in FIG. 7.

Figure 1:
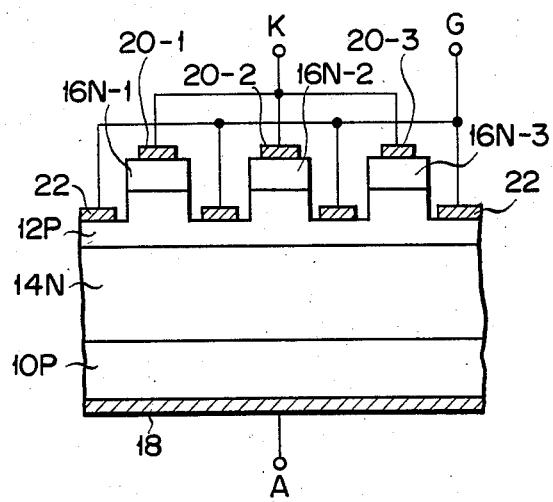
FIG. 1 shows a conventional GTO thyristor.
Figure 2:
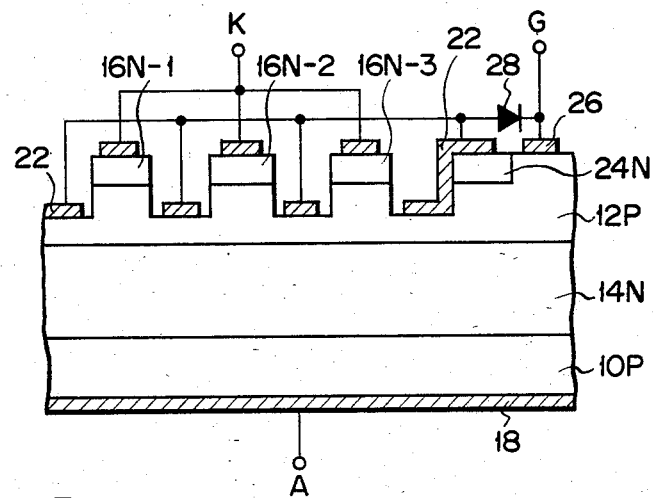
FIG. 2 shows the GTO thyristor in FIG. 1 having an auxiliary thyristor.
Figure 3:
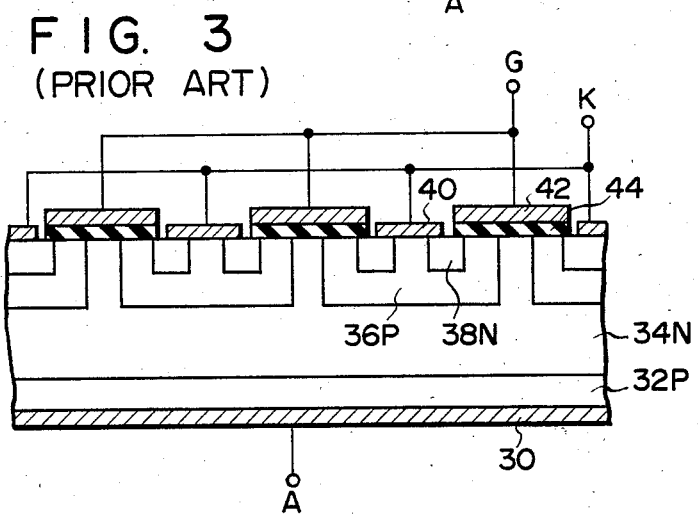
FIGS. 3 and 4 show conventional thyristors having a MOS gate structure.
Figure 4:
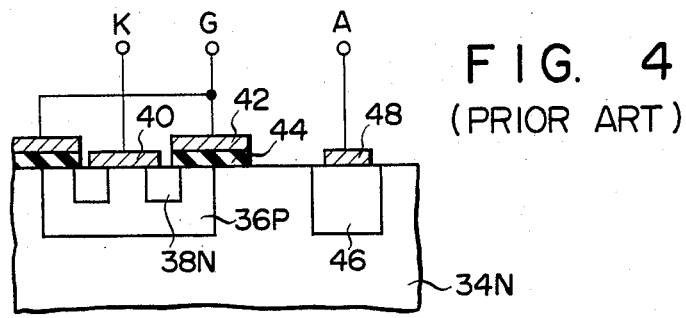

In such a semiconductor device, a driving current as in the conventional case will not continuously flow through the MOS gate circuit. Therefore, it is unnecessary to limit the anode current between the terminals A and K to be lower than needed in order to protect the semiconductor device from destruction. Also, this device does not need the diode 28 (FIG. 2) which was necessary conventionally, and can be turned on with the power loss of one third when compared with that of the device in FIG. 7.

Figure 9:
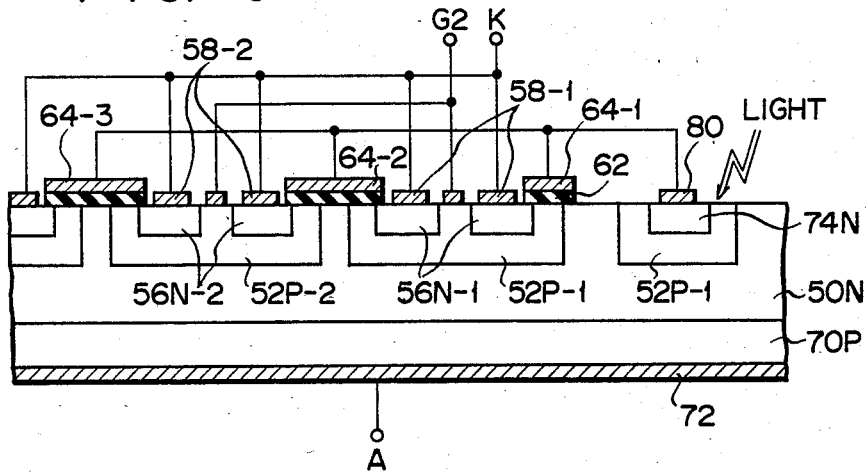
FIG. 9 shows a semiconductor device which is similar to FIG. 8 and is made conductive in response to an optical signal.

FIG. 9 shows a semiconductor device according to a fifth embodiment. This device is constituted substantially in the same manner as that shown in FIG. 8 except that the MOS gate circuit of FIG. 8 is replaced by a photothyristor. This photothyristor does not have the insulation layer 76 and the gate electrode 78 shown in FIG. 8, and is rendered conductive when light of a predetermined wavelength is emitted onto the layer 52P-1.

In the semiconductor device in this embodiment, since the light is used as a trigger pulse for turning the device on, malfunctions due to electrical noise will not occur.

Figure 10:
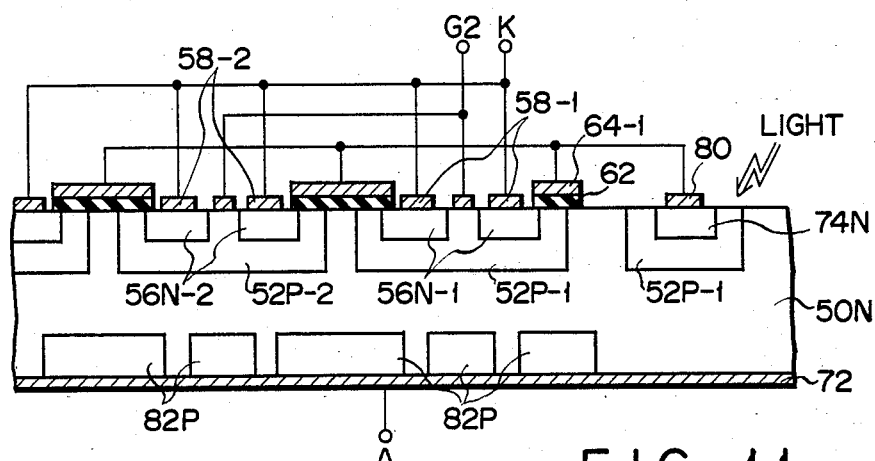
FIG. 10 shows a semiconductor device of the anode short type which is similar to the device of FIG. 9.

FIG. 10 shows a semiconductor device of the anode short type according to a sixth embodiment. This device has a p-type layer 82P which is formed in the bottom surface area of the layer 50N so as to surround the portions of the layer 50N which lie directly under the cathode electrodes 58-1 and 58-2. An anode electrode 72 is formed in contact with the layer 50N and the layer 82P. In such a semiconductor device, since the currents are not concentrated into the central portion of layers 56N-1 and 56N-2 when turned off but fade out, the semiconductor device is even more difficult to destroy.

Figure 11:
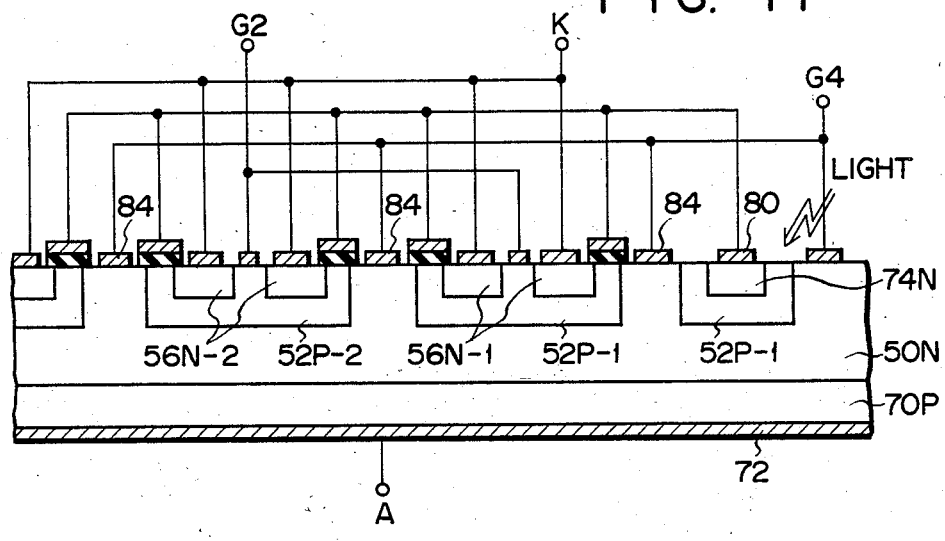
FIG. 11 shows a semiconductor device having a extra gate electrode for turn-off operation.

FIG. 11 shows a semiconductor device according to a seventh embodiment. This device has a gate electrode 84 which is formed on the p-type layer 50N and a terminal G4 which is connected to this gate electrode 84, in addition to the device of FIG. 9. When the potentials of the terminals G2 and A respectively are set lower than those of terminals K and G4, the currents are blocked not only at the p-n junctions between the layers 52P-1 and 52P-2, and the respection layers 56N-1 and 56N-2 but also at the p-n junction between the layers 70P and 50N due to the reverse biases. Thus, the time needed to turn off the device can be shortened.

Figure 12:
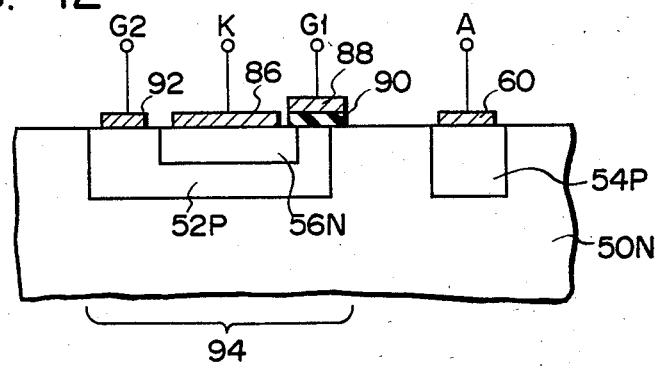
FIG. 12 shows a semiconductor device of a simple MOS gate structure.

FIG. 12 shows a semiconductor device according to an eighth embodiment. This device has an n-type layer 50N, p-type layers 52P and 54P which are formed in the surface area of the layer 50N, and an n-type layer 56N which is formed in the surface area of the layer 52P. The terminals A and K are connected to the anode electrode 60 and cathode electrode 86 which are formed on the layer 54P and layer 56N, respectively. The terminal G1 is connected to a gate electrode 88 which is formed over the layer 52P through an insulation layer 90. The terminal G2 is connected to a gate electrode 92 which is formed on the layer 52P. A different point of this device from the device in FIG. 5 is that the cathode electrode 86 and gate electrode 92 are not formed so as to surround the gate electrode 88. This device has such a structure that the current density cannot be made uniform, so that it is not fitted to control a large current, but its construction is simple.

Figure 13:
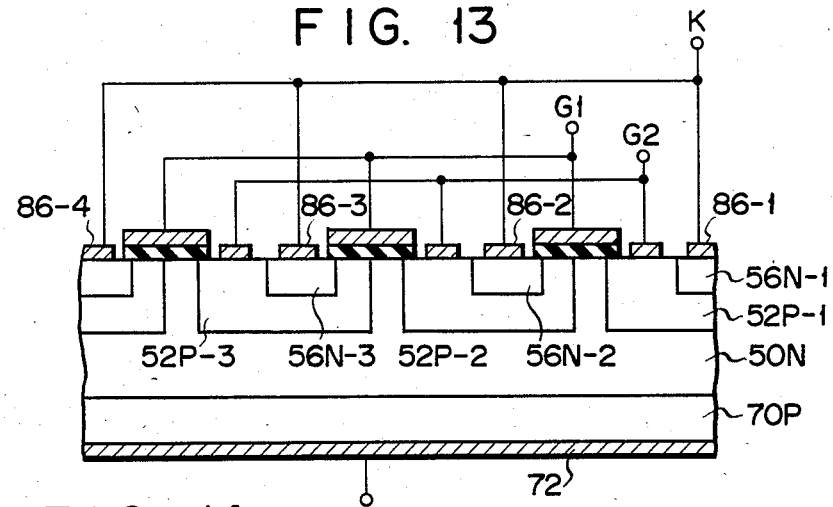
FIG. 13 shows a semiconductor device in which a plurality of portions each having a MOS gate structure shown in FIG. 12 are provided.

FIG. 13 shows a device in which a plurality of portions 94 in FIG. 12 are provided to make the current density uniform. In this device, the anode electrode 72 is located on the side opposite to cathode electrodes 86-1 to 86-4.

Figure 14:
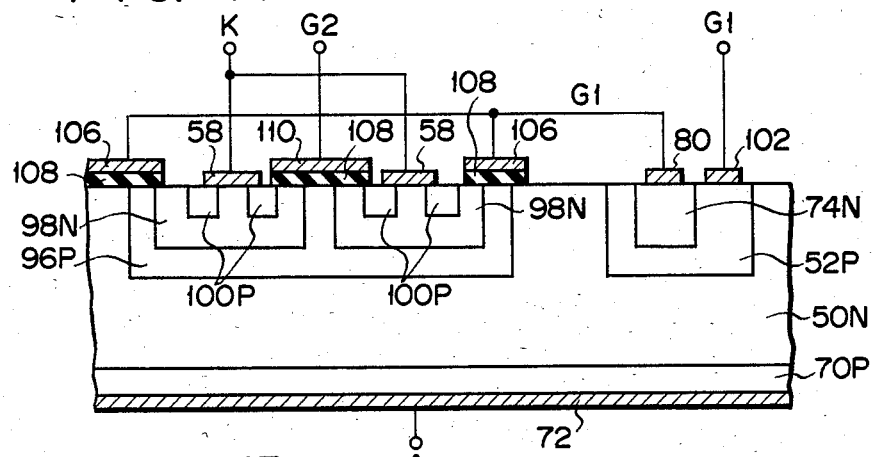
FIG. 14 shows a semiconductor device which includes first and second portions of MOS gate structure for respectively turning on and off the device, wherein the first portion is driven by an auxiliary thyristor.

A semiconductor device shown in FIG. 14 has a p-type layer 70P, an n-type layer 50N which is formed in contact with the layer 70P, p-type layers 96P and 52P which are formed in the surface area of the layer 50N, a layer 74N which is formed in the surface area of the layer 52P, an n-type layer 98N which is formed in the surface area of the layer 96P, and a p-type layer 100P which is formed in the surface area of the layer 98N. The cathode terminal K is connected to the cathode electrode 58 which is formed over the layers 100P and 98N. The anode terminal A is connected to the anode electrode 72 which is formed under the layer 70P. The ON terminal G1 is connected to a gate electrode 102 which is formed on the layer 52P. The electrode 80 on the layer 74N is connected to a gate electrode 106 which is formed through an insulation layer 108 over the surface area of the layer 96P. The terminal G2 is connected to a gate electrode 110 which is formed through the insulation layer 108 over the surface area of the layer 98N.

In the operation of the semiconductor device of this embodiment, when the terminal G1 is activated by a trigger pulse, a charge current is supplied to the gate electrode 106 through the anode electrode 72; and through layers 70P, 50N, 52P, 74N, and electrode 80, sequentially. When the potential of the gate electrode 106 is set at a level almost equal to that of the anode electrode 72, a current channel is formed in the surface area of the layer 96P which is located under this gate electrode 106. At this time, the current flows to the cathode electrode 58 through the anode electrode 72, layer 50N, current channel in the layer 96P, and layer 98N, sequentially. When this current reaches a predetermined value (i.e., breakover current), the current flows through the entire portion in the layer 96P.

In addition, when the potential of the terminal G2 is set lower than that of terminal K for turning off the device, the gate electrode 110 is charged, so that a current channel is formed in the layer 98N below this electrode 110. At this time, a current flows through this channel to the cathode electrode 58. That is, the current at the time of activation is shunted. This shunted current allows this device to be turned off when the current which flows sequentially through the layers 70P, 50N, 96P, and 98N becomes less than a predetermined value (i.e., holding current).

Figure 15:
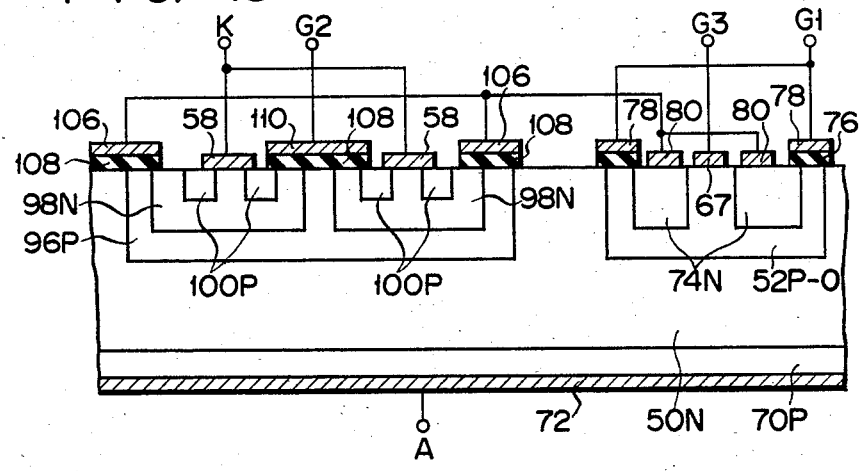
FIG. 15 shows a semiconductor device in which the auxiliary thyristor in FIG. 14 is constituted by an MOS gate thyristor.

FIG. 15 shows a semiconductor device in which the auxiliary thyristor in the semiconductor device of FIG. 14 is replaced by the MOS gate circuit shown in FIG. 8.

Figure 16:
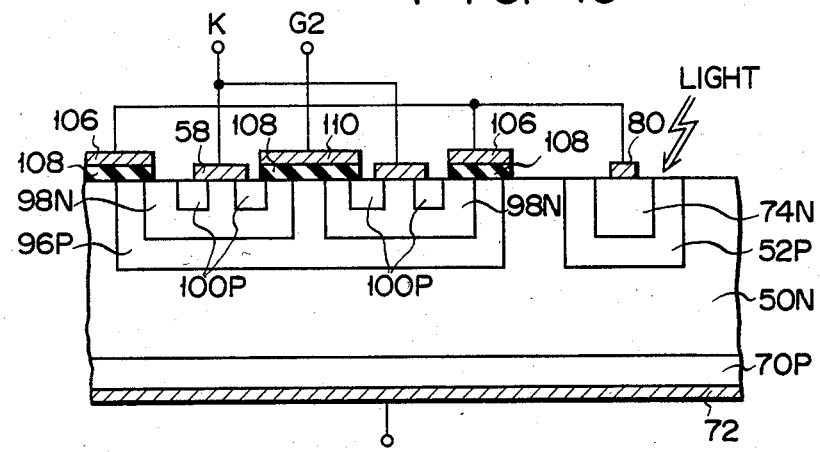
FIG. 16 shows a semiconductor device in which the auxiliary thyristor in FIG. 14 is substituted by a photothyristor.

FIG. 16 shows a semiconductor device in which the auxiliary thyristor in the semiconductor device of FIG. 14 is replaced by the photothyristor shown in FIG. 7.

Figure 17:
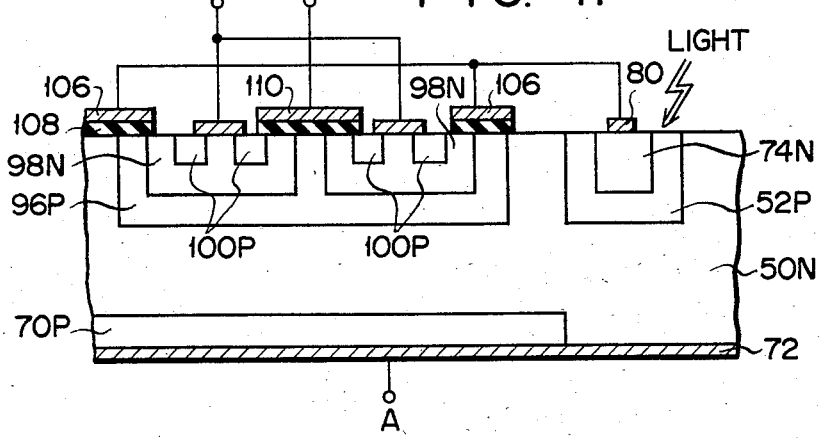
FIG. 17 shows a semiconductor device in which the photothyristor in FIG. 16 is substituted by a phototransistor.

FIG. 17 shows a semiconductor device in which the auxiliary thyristor is constituted by an photothyristor as shown in FIG. 10.

Figure 18:
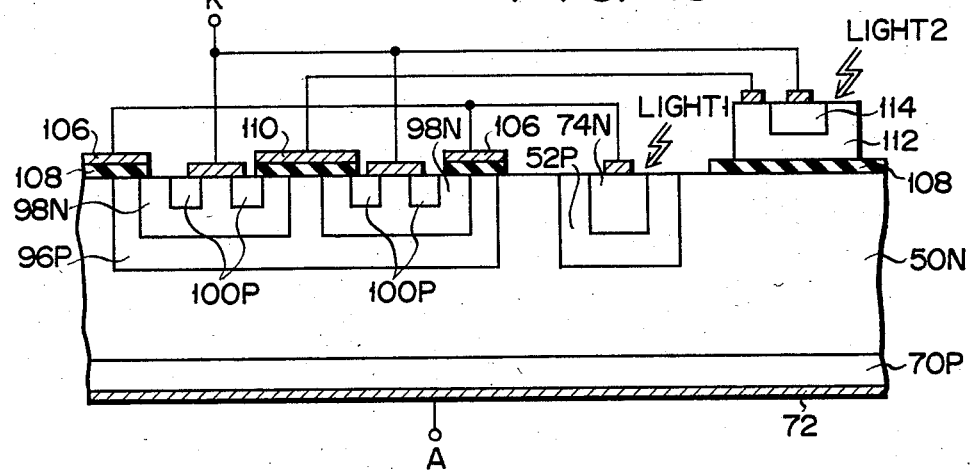
FIG. 18 shows a semiconductor device in which a photodiode for turning off the device is further provided in the device shown in FIG. 16.

FIG. 18 shows a semiconductor device in which a photodiode is formed insulatively over the layer 50N in addition to the device of FIG. 16. According to this device, the device can be optically turned off.

According to the present invention, the semiconductor device can be completely turned on and off with a small power loss.

In addition, the semiconductor devices of FIGS. 4 to 9, and FIGS. 12 and 13 can have a layer 82 (in FIG. 10) which is formed instead of the layers 54P or 70N.

In the embodiment of FIG. 8 has the electrode 84 formed on the layer 50N for applying a reverse bias voltage between the layers 50N and 70P. It is possible to add the electrode 84 to the devices of FIGS. 4 to 9, and FIGS. 12 and 13 for the same purpose.

The embodiments of FIGS. 9 to 11, and 16 to 18 can be modified to receive electrical signals in place of the light signal inputs.

What is claimed is:
1. A semiconductor device comprising:
a first layer of p-type conductivity;
a second layer of n-type conductivity contacting said first layer;
a third layer of p-type conductivity contacting said second layer;
a fourth layer of n-type conductivity contacting said third layer;
a fifth layer of p-type conductivity contacting said fourth layer;
an anode electrode formed on said first layer;
a cathode electrode formed on said fourth and fifth layers;
a first gate electrode insulatively formed over said third layer, forming a first field-effect transistor in cooperation with said second, third and fourth layers and forming a first current channel in the surface of said third layer interposed between said second and fourth layers upon receipt of a turn-on signal, flow of current in said first current channel removing the electrical barrier between said second and third layers and permitting current flow between said anode and cathode electrodes, and
a second gate electrode insulatively formed over said fourth layer, forming a second field-effect transistor in cooperation with said third, fourth and fifth layers, whereupon application of a turn-off signal to said second electrode forms a second current channel in the surface of said fourth layer interposed between said third and fifth layers, reestablishing the electrical barrier betwen said second and third layers and blocking said current flow between said anode and cathode electrodes.

2. A semiconductor device according to claim 1, wherein said third layer is formed in the surface of said second layer, said fourth layer is formed in the surface of said third layer, and said fifth layer is formed in the surface of said fourth layer.

3. A semiconductor device according to claim 2, wherein said fourth and fifth layers are formed as annular areas.

4. A semiconductor device according to claim 3, further comprising switching means connected between said anode electrode and said first gate electrode, said switching means being turned on by a trigger signal.

5. A semiconductor device according to claim 4, wherein said switching means includes a sixth layer of p-type conductivity formed in the surface of said second layer, a seventh layer of n-type conductivity formed in the surface of said sixth layer, a drive electrode connected to said first gate electrode, and a control electrode formed on said sixth layer, thus forming a thyristor in cooperation with said first, second, sixth and seventh layers, said thyristor being turned on when an electrical trigger signal is supplied to said control electrode.

6. A semiconductor device according to claim 4, wherein said swtiching means includes a sixth layer of p-type conductivity formed in the surface of said second layer, a seventh layer of n-type conductivity formed in the surface of said sixth layer, and a control electrode insulatively formed over said sixth layer, forming a MOS type thyristor in cooperation with said first, second, sixth and seventh layers, said MOS type thyristor being turned on when an electrical trigger signal is supplied to said control electrode.

7. A semiconductor device according to claim 6, wherein said switching means further includes a second control electrode formed on said sixth layer for receiving a trigger signal to turn off said MOS type thyristor.

8. A semiconductor device according to claim 4, wherein said switching means includes a sixth layer of p-type conductivity formed in the surface of said second layer, a seventh layer of n-type conductivity formed in the surface of sixth layer and a drive electrode connected to said first gate electrode, said first, second, sixth and seventh layers acting as a photo-thyristor to be turned on when an optical trigger signal is supplied to said sixth layer.

9. A semiconductor device according to claim 4, wherein said switching means includes a sixth layer of p-type conductivity formed in the surface of said second layer, a seventh layer of n-type conductivity formed in the surface of said sixth layer, and a drive electrode connected to said first gate electrode and formed in contact with that portion of said second layer located under said sixth layer, said second, sixth and seventh layers acting as a phototransistor to be turned on when an optical trigger signal is supplied to said sixth layer.

10. A semiconductor device according to claim 3, further comprising first switching means connected between said anode electrode and said first gate electrode to be turned on by a first trigger signal, and second switching means connected between said cathode electrode and said second gate electrode to be turned on by a second trigger signal.

* * * * *